US010065212B2

(12) United States Patent
Wallis

(10) Patent No.: US 10,065,212 B2
(45) Date of Patent: Sep. 4, 2018

(54) ULTRASONIC TRANSMITTER

(71) Applicant: MOTOROLA SOLUTIONS, INC., Schaumburg, IL (US)

(72) Inventor: David W. Wallis, Atlanta, GA (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 396 days.

(21) Appl. No.: 14/845,767

(22) Filed: Sep. 4, 2015

(65) Prior Publication Data
US 2017/0066016 A1 Mar. 9, 2017

(51) Int. Cl.
B06B 1/06 (2006.01)
G10K 11/26 (2006.01)
H01L 41/04 (2006.01)
G10K 9/18 (2006.01)
G10K 11/28 (2006.01)

(52) U.S. Cl.
CPC .............. B06B 1/0644 (2013.01); G10K 9/18 (2013.01); G10K 11/26 (2013.01); G10K 11/28 (2013.01); H01L 41/042 (2013.01)

(58) Field of Classification Search
CPC ...... B06B 1/0644; G10K 11/26; G10K 11/28; G10K 9/18; H01L 41/042
See application file for complete search history.

(56) References Cited

U.S. PATENT DOCUMENTS

| 3,325,779 | A | 6/1967 | Supernaw et al. |
| 3,391,385 | A | 7/1968 | Lubell |
| 3,970,879 | A | 7/1976 | Kumon |
| 5,327,985 | A | 7/1994 | Porzilli |
| 6,533,065 | B2 | 3/2003 | Zanker |
| 6,763,722 | B2 | 7/2004 | Fjield et al. |
| 7,762,715 | B2 | 7/2010 | Gordon et al. |

(Continued)

FOREIGN PATENT DOCUMENTS

| DE | 437586 | 11/1926 |
| EP | 0209238 | 1/1987 |
| EP | 1060798 | 12/2000 |

OTHER PUBLICATIONS

PCT/US2016/046007 International Search Report and Written Opinion of the International Searching Authority dated Dec. 1, 2016 (13 pages).

Primary Examiner — Daniel T Pihulic
(74) Attorney, Agent, or Firm — Michael Best & Friedrich LLP

(57) ABSTRACT

An ultrasonic transmitter. The ultrasonic transmitter includes a first enclosure, a second enclosure, a piezoelectric transducer, a first piston, and a second piston. The first enclosure has an opening for directing an output of the ultrasonic transmitter in a first direction and a wall opposite the opening. The second enclosure has a first opening aligned in the first direction and a second opening opposite the first opening. The second enclosure is positioned in the first enclosure with the second opening directed toward the wall. The piezoelectric transducer is positioned in the second enclosure and movable relative to the first enclosure. When an ultrasonic electric signal is applied to the piezoelectric transducer, the piezoelectric transducer expands and contracts pulsing the first and second pistons to produce ultrasonic sound waves from the first and second openings which combine and our output by the ultrasonic transmitter.

16 Claims, 4 Drawing Sheets

(56) References Cited

U.S. PATENT DOCUMENTS

| | | |
|---|---|---|
| 2007/0080609 A1 | 4/2007 | Johnson et al. |
| 2007/0159028 A1 | 7/2007 | Nagoya et al. |
| 2017/0066016 A1* | 3/2017 | Wallis .................. B06B 1/0644 |

* cited by examiner

ULTRASONIC TRANSMITTER

BACKGROUND OF THE INVENTION

Ultrasonic transmitters produce sound waves having an ultrasonic frequency (i.e., greater than 20,000 hertz). The ultrasonic sound waves are able to propagate energy across a distance of several feet.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
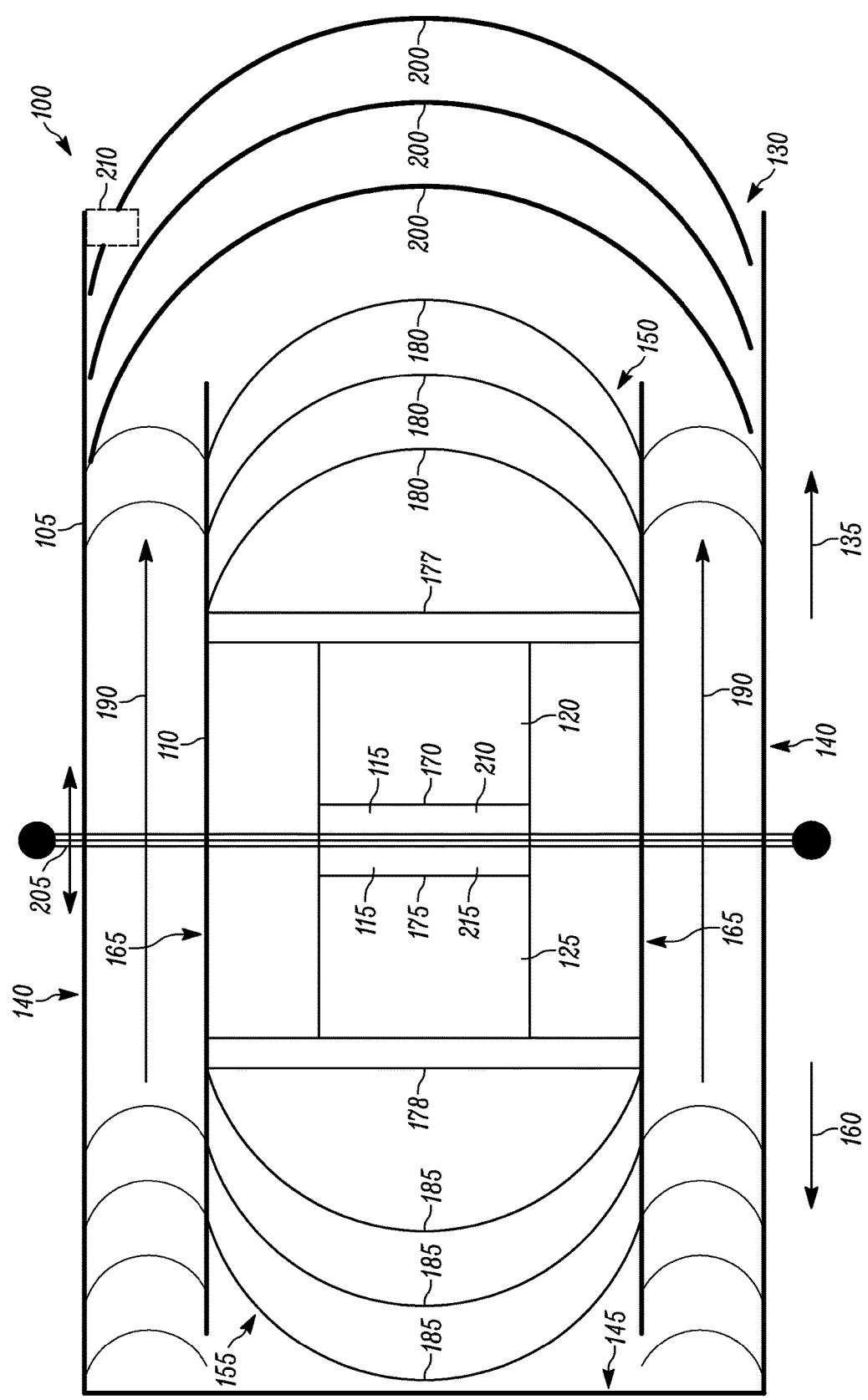
FIG. 1 is a cut-away view of an ultrasonic transmitter in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One embodiment provides an ultrasonic transmitter. The ultrasonic transmitter includes a first enclosure, a second enclosure, a piezoelectric transducer, a first piston, and a second piston. The first enclosure has an opening for directing an output of the ultrasonic transmitter in a first direction and a wall opposite the opening. The second enclosure has a first opening aligned in the first direction and a second opening opposite the first opening. The second enclosure is positioned in the first enclosure with the second opening directed toward the wall. The piezoelectric transducer is positioned in the second enclosure and movable relative to the first enclosure. The first piston is contained within the second enclosure and coupled to the piezoelectric transducer, and a head of the first piston is directed toward the first opening. The second piston is contained within the second enclosure and coupled to the piezoelectric transducer, and a head of the second piston is directed toward the second opening. When an ultrasonic electric signal is applied to the piezoelectric transducer, the piezoelectric transducer expands and compresses pulsing the first and second pistons to produce ultrasonic sound waves from the first and second openings. The ultrasonic sound waves from the second opening bounce off the wall and travel around the second enclosure, combining with the ultrasonic sound waves from the first opening. The ultrasonic transmitter outputs the combined ultrasonic sound waves.

FIG. 1 is a cut-away view of an embodiment of an ultrasonic transmitter 100. The ultrasonic transmitter 100 has a first enclosure 105, a second enclosure 110, a piezoelectric transducer 115, a first piston 120, and a second piston 125.

The first enclosure 105 has an opening 130 in a first direction 135 and is closed in all other directions thus having side walls 140 and a back wall 145. The second enclosure 110 has a first opening 150 in a first direction 135 and a second opening 155 in a second direction 160 and has side walls 165. The second enclosure 110 is positioned in the first enclosure 105, and the first direction 135 is aligned in the direction 135 of the opening 130 of the first enclosure 105, and the second direction 160 is opposite the first direction 135 and toward the back wall 145 of the first enclosure 105.

The piezoelectric transducer 115 is positioned in the second enclosure 110. The first piston 120 is positioned in the first enclosure 105 and in contact with a first side 170 of the piezoelectric transducer 115. The second piston 125 is also positioned in the first enclosure 105 and in contact with a second side 175 of the piezoelectric transducer 115. Thus, a first piston head 177 faces in the first direction 135 toward the first opening 150 and a second piston head 178 faces in the second direction 160 toward the second opening 155. The first piston head 177 and the second piston head 178 are in contact with the side walls 165 of the second enclosure 110 forming an air tight seal between the first piston head 177 and the second piston head 178 and the side walls 165 of the second enclosure 110.

When an electric signal having an ultrasonic frequency (e.g., an alternating current signal or a pulsed direct current signal) is applied to the piezoelectric transducer 115, the piezoelectric transducer 115 expands and contracts at the frequency of the applied electric signal. The expansion and contraction of the piezoelectric transducer 115 causes the first piston 120 to move toward and away from the first opening 150 of the second enclosure 110, producing a first ultrasonic sound wave 180. The expansion and contraction of the piezoelectric transducer 115 also causes the second piston 125 to move toward and away from the second opening 155 of the second enclosure 110, producing a second ultrasonic sound wave 185. The first ultrasonic sound waves 180 and the second ultrasonic sound waves 185 have the same frequency as the frequency of the electric signal.

The second ultrasonic sound waves 185 bounce off the back wall 145 of the first enclosure 105 and travel around the second enclosure 110 (shown by arrows 190). When the second ultrasonic sound waves 185 pass the first opening 150 of the second enclosure 110, the second ultrasonic sound waves 185 combine with the first ultrasonic sound waves 180 to form combined ultrasonic sound waves 200.

The first ultrasonic sound waves 180 have a first propagation delay until they reach the first opening 150. The second ultrasonic sound waves 185 have a second propagation delay until they reach the first opening 150. Based on the frequency of the electric signal, and first and second propagation delays, the second ultrasonic sound waves 185 may be additive or subtractive to the first ultrasonic sound waves 180. Thus, the combined ultrasonic sound waves 200 can have an energy that ranges from zero (i.e., the first and second ultrasonic sound waves 180 degrees out of phase) to double (the first and second ultrasonic sound waves in phase with each other) the energy of the first ultrasonic sound waves 180.

The opening 130 of the first enclosure 105 directs and focuses combined ultrasonic sound waves 200 output by the ultrasonic transmitter 100.

In some embodiments, the piezoelectric transducer 115 includes two piezoelectric elements, a first piezoelectric transducer 210 and a second piezoelectric transducer 215. The first piezoelectric transducer 210 contacts the first piston 120 and the second piezoelectric transducer 215 contacts the second piston 125. Separate electric signals can be applied to the first piezoelectric transducer 210 and the second piezoelectric transducer 215 allowing the first piston 120 and the second piston 125 to move in the same direction (e.g., toward the first opening 150 and the second opening 155) at the same time. This operation allows air between the first piston head 177 and the second piston head 178 to maintain an equilibrium.

In the embodiment shown in FIG. 1, a mounting structure 205 extends through the first enclosure 105 and the second enclosure 110. The piezoelectric transducer 115 is mounted to the mounting structure 205. The mounting structure 205 is movable toward and away from the back wall 145. Moving the mounting structure 205 moves the piezoelectric transducer 115 and the first piston 120 and the second piston 125. This movement allows the ultrasonic transmitter 100 to be "tuned" such that the second ultrasonic sound waves 185 are fully additive to the first ultrasonic sound waves 180, maximizing the power output of the ultrasonic transmitter 100. In some embodiments, the second enclosure 110 moves along with the mounting structure 205. In other embodiments, the second enclosure is stationary relative to the first enclosure 105. The mounting structure 205 can be moved by manual means or by a powered system.

Tuning of the ultrasonic transmitter 100 can be assisted by a sensor 220. The sensor 220 can be external to the ultrasonic transmitter 100 or can be optionally mounted near the opening 130 of the first enclosure 105 (e.g., on a wall of the first enclosure 105 or suspended in the opening 130) such that the sensor 220 detects the combined ultrasonic sound waves 200.

In one embodiment, the sensor 220 provides feedback to a user who then moves the mounting structure 205 to obtain maximum power output for the ultrasonic transmitter 100. In another embodiment, the sensor 220 provides feedback to a controller. In some embodiments, the controller operates an auto positioning system to move the mounting structure 205 to the optimum position for maximum power output from the ultrasonic transmitter 100. In another embodiment, the controller adjusts the frequency of the electric signal(s) to account for the first and second propagation delays and maximize the output of the ultrasonic transmitter 100.

Figure 2A:
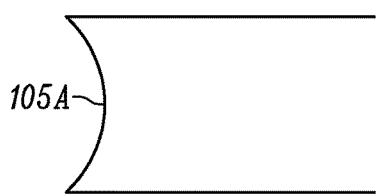
FIGS. 2A through 2E are cut-away side and end views of first enclosures of ultrasonic transmitters in accordance with some embodiments.
Figure 2A:
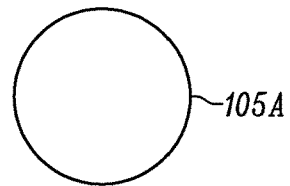
Figure 2B:
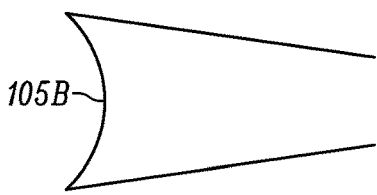
Figure 2B:
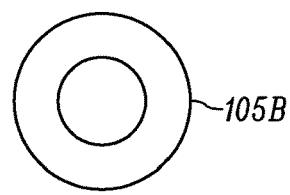
Figure 2C:
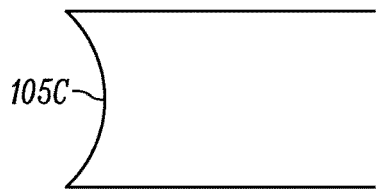
Figure 2C:
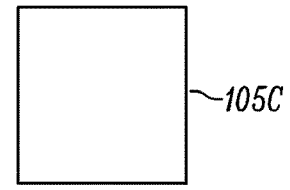
Figure 2D:
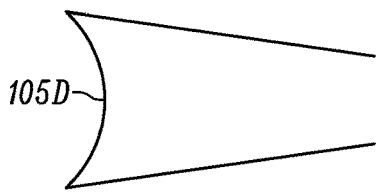
Figure 2D:
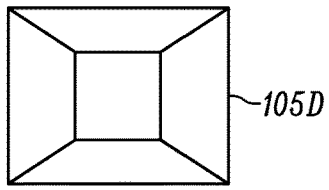
Figure 2E:
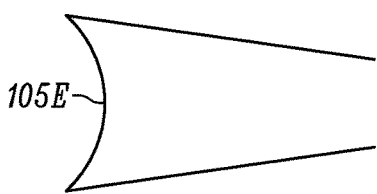
Figure 2E:
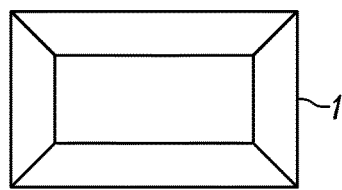
Figure 3A:
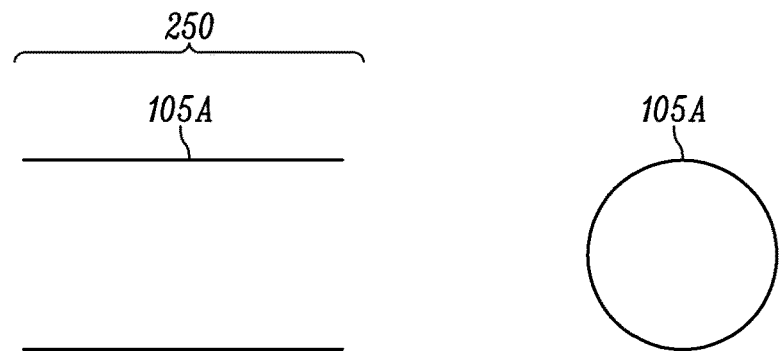
FIGS. 3A through 3F are cut-away side and end views of second enclosures of ultrasonic transmitters in accordance with some embodiments.
Figure 3B:
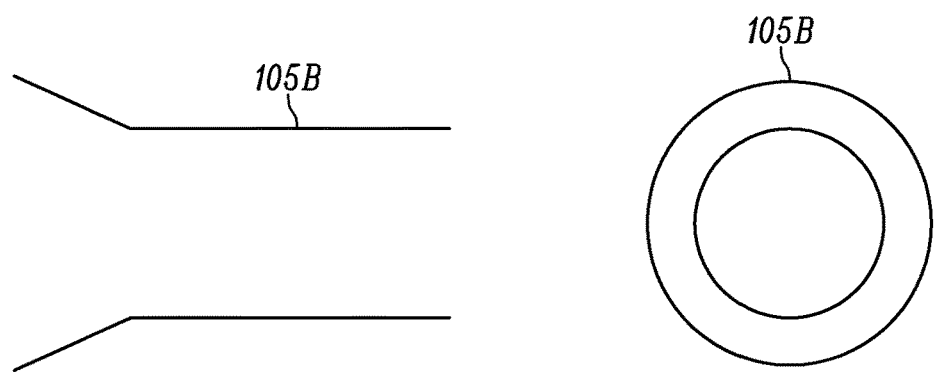
Figure 3C:
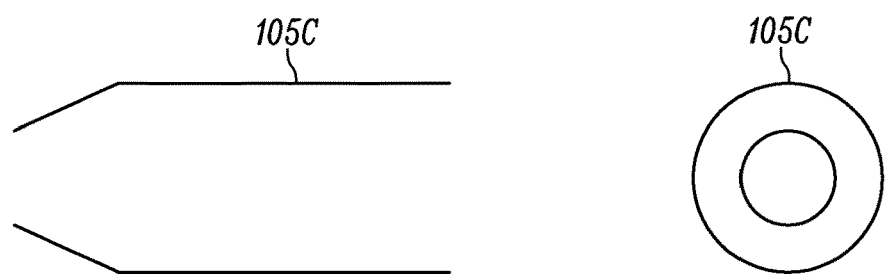
Figure 3D:
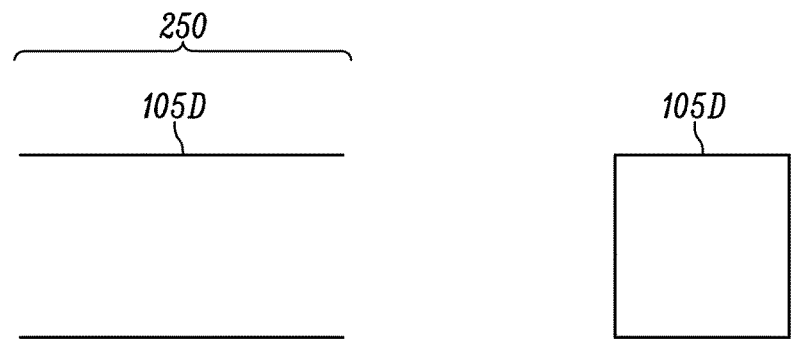
Figure 3E:
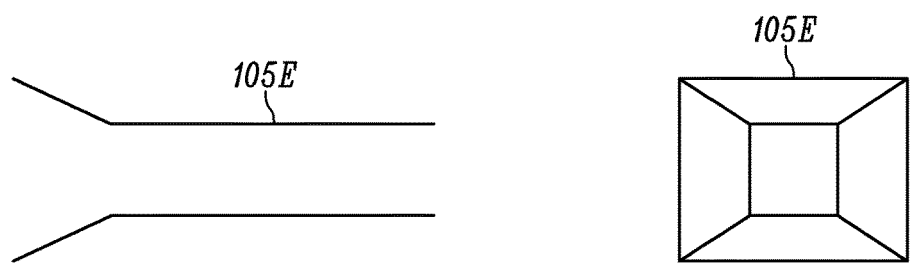
Figure 3F:

In the embodiment shown, the first enclosure 105 and the second enclosure 110 are cylinders. However, the geometry of the first enclosure 105 and the second enclosure 110 can be other shapes such as square, rectangular, and irregular. For example, FIGS. 2A through 2x show possible irregular shapes first enclosures 105A through 105E. The shape of the back wall 145 can be bowed or another shape chosen to assist in deflecting the second ultrasonic sound waves 185. A stiffness of the side walls 140 and 165 and the back wall 145 is chosen to assist in deflecting and focusing the first ultrasonic sound waves 180, the second ultrasonic sound waves 185, and the combined ultrasonic sound waves 200.

For example, FIGS. 3A through 3F show possible irregular shapes second enclosures 110A through 110F. As a general rule, the second enclosure 110 needs a section 250 that is straight such that the first piston 120 and the second piston 125 are able to contact the second enclosure 110 for the entire distance of their travel.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. An ultrasonic transmitter, the ultrasonic transmitter comprising:
   a first enclosure having an opening for directing an output of the ultrasonic transmitter in a first direction and a wall opposite the opening;
   a second enclosure defined in part by a side wall and having a first opening aligned in the first direction and a second opening opposite the first opening, the second enclosure positioned in the first enclosure with the second opening directed toward the wall;
   a piezoelectric transducer positioned in the second enclosure and movable relative to the first enclosure;
   a first piston contained within the second enclosure and coupled to the piezoelectric transducer, a head of the first piston forming an airtight seal with the side wall and directed toward the first opening; and
   a second piston contained within the second enclosure and coupled to the piezoelectric transducer, a head of the second piston forming an airtight seal with the side wall and directed toward the second opening;
   wherein when an ultrasonic electric signal is applied to the piezoelectric transducer, the piezoelectric transducer pulses the first and second pistons to produce ultrasonic sound waves from the first and second openings, the ultrasonic waves from the second opening bounce off the wall and travel around the second enclosure and combine with the ultrasonic sound waves from the first opening, the ultrasonic transmitter outputting the combined ultrasonic sound waves.

2. The ultrasonic transmitter of claim 1, wherein the piezoelectric transducer is moved to a position such that the ultrasonic sound waves from the first and second openings are in phase when the ultrasonic sound waves are combined, the ultrasonic transmitter producing an output having about double an energy of the ultrasonic sound waves from the first opening.

3. The ultrasonic transmitter of claim 1, further comprising a sensor configured to sense the output of the ultrasonic transmitter.

4. The ultrasonic transmitter of claim 3, wherein a position of the piezoelectric transducer is adjusted based on feedback from the sensor.

5. The ultrasonic transmitter of claim 4, further comprising an auto positioning device for positioning the piezoelectric transducer.

6. The ultrasonic transmitter of claim 4, further comprising a controller, the controller adjusting the ultrasonic frequency of the ultrasonic electric signal based on the feedback.

7. The ultrasonic transmitter of claim 1, wherein the piezoelectric transducer is fixed in the second enclosure and the piezoelectric transducer is positioned in the first enclosure by moving the second enclosure.

8. The ultrasonic transmitter of claim 1, wherein the piezoelectric transducer includes a first piezoelectric transducer and a second piezoelectric transducer, the first piezoelectric transducer pulsing the first piston and the second piezoelectric transducer pulsing the second piston.

9. A method of generating an ultrasonic sound wave by an ultrasonic transmitter having a first enclosure and a second enclosure, the method comprising:
   applying an ultrasonic electric signal to a piezoelectric transducer positioned in the second enclosure;
   forming an air tight seal between a head of a first piston and the second enclosure, and between a head of a second piston and the second enclosure;
   pulsing, by the piezoelectric transducer, the first piston and the second piston in the second enclosure;
   generating first ultrasonic sound waves by the first piston in a first direction;
   generating second ultrasonic sound waves by the second piston in a second direction, the second direction opposite the first direction;
   bouncing the second ultrasonic sound waves off a wall of the first enclosure and around the second enclosure;
   combining the first and second ultrasonic sound waves; and
   directing the combined first and second ultrasonic sound waves out of the first enclosure in the first direction.

10. The method of claim 9, further comprising moving the piezoelectric transducer such that the first and second ultrasonic sound waves are in phase and the combined first and second ultrasonic sound waves have about double the energy of the first ultrasonic sound waves.

11. The method of claim 9, further comprising sensing the combined first and second ultrasonic sound waves.

12. The method of claim 11, further comprising moving the piezoelectric transducer based on the sensed combined first and second ultrasonic sound waves.

13. The method of claim 9, further comprising adjusting a frequency of the ultrasonic electric signal such that the combined first and second ultrasonic sound waves have about double the energy of the first ultrasonic sound waves.

14. The method of claim 9, further comprising bringing the first piston in contact with the piezoelectric transducer, and bringing the second piston in contact with the piezoelectric transducer.

15. The method of claim 9, further comprising providing an opening of the first enclosure in the first direction.

16. The method of claim 9, further comprising providing a first opening of the second enclosure in the first direction and a second opening of the second enclosure in a second direction.

\* \* \* \* \*